(12) United States Patent
Fuller, Jr. et al.

(10) Patent No.: US 6,529,379 B1
(45) Date of Patent: Mar. 4, 2003

(54) ARTICLE EXHIBITING ENHANCED ADHESION BETWEEN A DIELECTRIC SUBSTRATE AND HEAT SPREADER AND METHOD

(75) Inventors: James W. Fuller, Jr., Endicott, NY (US); Jeffrey A. Knight, Endwell, NY (US)

(73) Assignee: International Business Machines Corporation, Armonk, NY (US)

( * ) Notice: Subject to any disclaimer, the term of this patent is extended or adjusted under 35 U.S.C. 154(b) by 350 days.

(21) Appl. No.: 09/172,732

(22) Filed: Oct. 13, 1998

(51) Int. Cl.⁷ .................................................. H05K 7/20
(52) U.S. Cl. ...................... 361/705; 361/706; 174/52.2; 257/678
(58) Field of Search ................................ 361/705, 706; 174/52.2, 52.4; 427/226, 379, 380, 372, 419.2, 419.3; 428/432, 212, 433, 472, 697, 699, 702, 209; 359/360, 577, 580, 581, 582, 585, 586; 257/666, 678, 677, 667, 706, 712, 717, 751, 713, 795; 165/80.2, 80.3

(56) References Cited

U.S. PATENT DOCUMENTS

| 4,042,539 A |   | 8/1977 | Fanning .................... 260/16 |
| 4,740,425 A | * | 4/1988 | Leland et al. .............. 428/447 |
| 4,876,588 A | * | 10/1989 | Miyamoto .................. 257/706 |
| 4,914,551 A |   | 4/1990 | Anschel et al. ............. 361/389 |
| 5,022,968 A | * | 6/1991 | Lin et al. ....................... 204/28 |
| 5,028,984 A |   | 7/1991 | Ameen et al. ................. 357/72 |
| 5,206,792 A |   | 4/1993 | Reynolds ..................... 361/386 |
| 5,208,103 A |   | 5/1993 | Miyamoto ................... 428/354 |
| 5,218,215 A |   | 6/1993 | Liang et al. ................. 257/712 |
| 5,262,674 A |   | 11/1993 | Banerji et al. .............. 257/712 |
| 5,300,158 A | * | 4/1994 | Chen et al. .................. 148/258 |
| 5,343,073 A | * | 8/1994 | Parthassarathi et al. ..... 257/666 |
| 5,346,765 A |   | 9/1994 | Maeda et al. ............... 428/354 |
| 5,367,196 A | * | 11/1994 | Mahulikar et al. ........... 257/787 |
| 5,422,788 A |   | 6/1995 | Heinen et al. ............... 361/705 |
| 5,591,034 A |   | 1/1997 | Ameen et al. ................. 439/91 |
| 5,608,267 A | * | 3/1997 | Mahulikar et al. ........... 257/796 |

OTHER PUBLICATIONS

Frey et al, "Thermal conductive Adhesive", *IBM TDB*, vol. 27, No. 6A, Jun. 1994, pp. 117–118.

Ameen et al., "Thermally Enhanced Surface Mount Modular Tape Automated Bonding Package", *Research Disclosure*, No. 304, Aug. 1989.

Hayden, et al, "Thermally Conductive, Reworkable, Elastomeric Interposer for Chip to Heat Sink Attachment" *IBM TDB*, No. 7, Dec. 1992, pp. 241–242.

* cited by examiner

*Primary Examiner*—Darren Schuberg
*Assistant Examiner*—Michael Datskovsky
(74) *Attorney, Agent, or Firm*—Connolly Bove Lodge & Hutz; Lawrence R. Fraley

(57) ABSTRACT

Providing a layer of ZnCr intermediate a dielectric substrate and a heat spreader enhances the adhesion between the dielectric substrate and heat spreader.

21 Claims, 1 Drawing Sheet

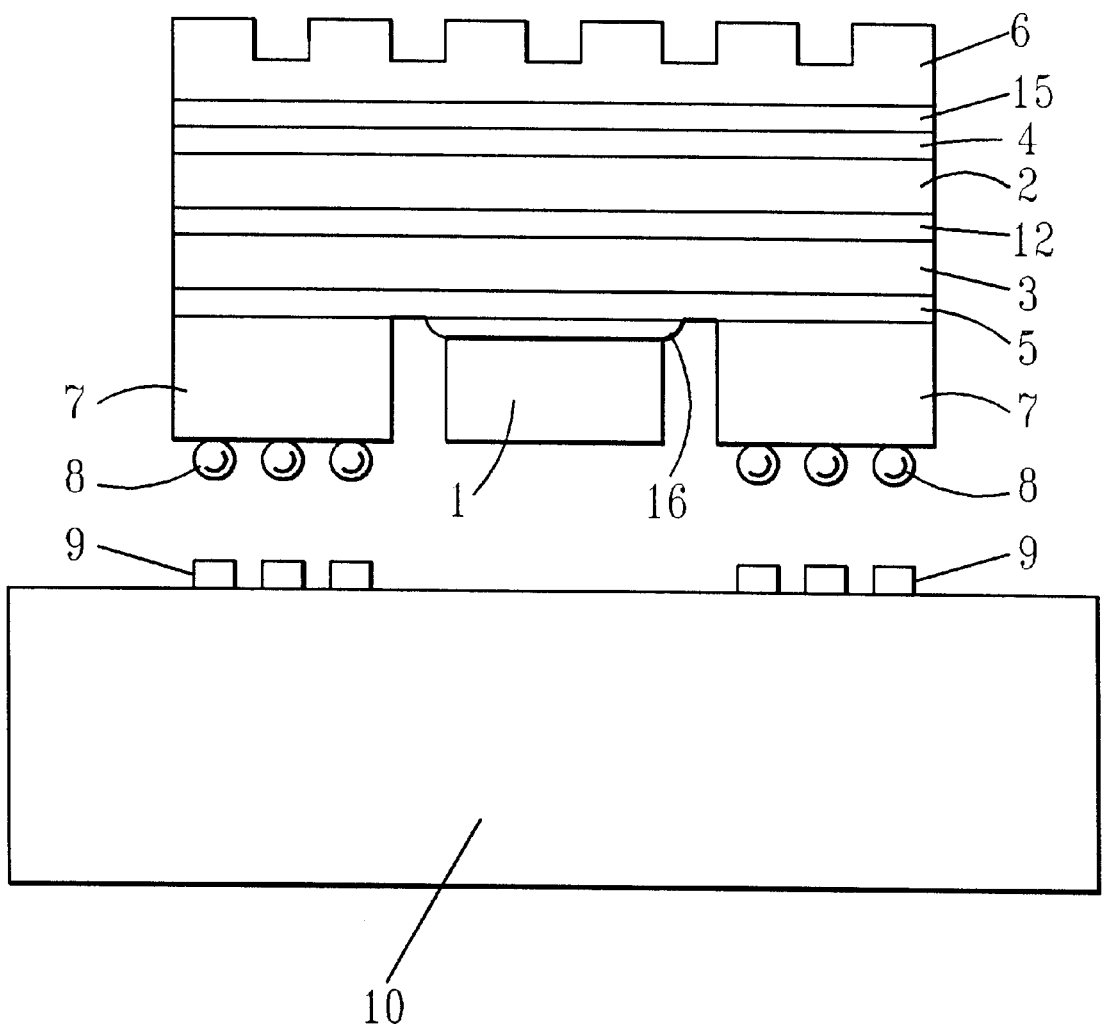

ARTICLE EXHIBITING ENHANCED ADHESION BETWEEN A DIELECTRIC SUBSTRATE AND HEAT SPREADER AND METHOD

TECHNICAL FIELD

The present invention is concerned with improving the adhesion between a dielectric substrate and the heat sink or heat spreader attached to the substrate. More particularly, the present invention is concerned with electronic packages that have a heat sink or spreader as one of its components. In addition, the electronic packages include an electronic component such as a semiconductor chip. According to the present invention, the adhesive bond between the heat sink or spreader and dielectric substrate upon which the heat sink or spreader is located is greatly enhanced.

BACKGROUND OF THE INVENTION

Integrated circuit chips are continually being fabricated with higher circuit densities and smaller geometries. The amount of power consumed employing these integrated circuit chips exhibiting increased circuit density also is increased, thereby increasing the amount of heat generated. This in turn places greater demands upon the efficiency of heat removal generated during package operation in order to assure that the operating parameters of these devices are maintained within specific tolerances to thereby prevent damage to the package from overheating.

One well known means for providing heat removal is to utilize a metal or ceramic heat sink or more typically referred to as a heat spreader as used hereinafter. The heat spreader, in many instances, has been connected to the integrated circuit components by employing an adhesive to directly bond to the organic or ceramic surfaces of the electronic components. One of the more common adhesive materials employed have been the epoxy based materials. However, the heat spreader material (e.g. copper, nickel-coated copper, aluminum, anodized aluminum, chromium on aluminum) does not adequately adhere to epoxy and difficulties exist in maintaining the bond during thermal cycling. In order to reduce delamination problems, it has been suggested to increase the thermal conduction of the epoxy by incorporating a thermoconductive metal or ceramic particle in the epoxy to thereby increase its CTE (coefficient of thermal expansion) to bring it more in line with that of the material of the heat spreader. Nevertheless, room for improvement still exists with respect to the bond between the heat spreader and epoxy material.

In addition, attempts to use silicon adhesives for such purposes have been carried out, but such adhesives exhibit bond strengths with the heat spreader that is only about 1/3 to about 1/2 the strength of the epoxy materials. Moreover, constituents of silicon adhesives have a tendency to migrate out thereby contaminating surfaces with a microthin coating which prevents subsequent attachment of other organic materials to the circuit boards such as photoresists, solder resists, and encapsulents. Furthermore, contamination is especially a problem for reworking components because heating the silicon during rework greatly increases the contamination and prevents any subsequent encapsulation or other non-silicon processes on the circuit board that may be required for rework.

In view of the foregoing discussion, it would be desirable to improve the adhesion between the heat spreader and adhesive that contacts the electronic components of the package in order to provide increased resistance to delamination and package cracking, while also assuring adequate thermal transport capability.

It would also be desirable to provide a process that achieves improved adhesion that is more efficient and easier to carry out than the processes now commonly practiced.

SUMMARY OF INVENTION

The present invention is concerned with an article that comprises a dielectric substrate and a heat spreader located adjacent the substrate. The heat spreader is typically metallic. In order to improve the adhesion between the dielectric substrate and the heat spreader, a layer of a codeposited ZnCr is provided intermediate the dielectric substrate and the heat spreader. In addition, the present invention is concerned with electronic packages that include an integrated circuit chip surrounded by a dielectric, a heat spreader located adjacent the dielectric substrate and a layer of codeposited ZnCr intermediate the dielectric substrate and the heat spreader.

The present invention is also concerned with the process for fabricating the above-defined article. In particular, the process of the present invention involves providing a layer of a codeposited ZnCr on at least one major surface of a heat spreader, and then laminating the heat spreader to a dielectric substrate. By adhering the heat spreader to the dielectric prior to such steps as positioning of the integrated circuit chip on the circuit board, delamination is prevented during subsequent processing steps because of the enhanced adhesion achieved by the present invention. Subsequent processing steps typically include baking, die attaching, post heating, ball grid array attaching and masking. Such processing steps subject the structure to relatively high temperatures which, without the tenacious bond formed according to the present invention, could result in separation or delamination of the heat spreader from the dielectric.

Still other objects and advantages of the present invention will become apparent by those skilled in the art from the following description, wherein it is shown and described only the preferred embodiments of the present invention, simply by illustration of the best mode contemplated of carrying out the invention. As will be realized, the invention is capable of other and different embodiments, and its several details are capable of modifications in various obvious respects, without departing from the invention. Accordingly, the drawings and description are to be regarded as illustrative in nature and not as restrictive.

BRIEF DESCRIPTION OF DRAWINGS

FIG. 1 is a schematic diagram of an electronic module of the present invention.

BEST AND VARIOUS MODES FOR CARRYING OUT INVENTION

In order to facilitate an understanding of the present invention, reference will be made to the drawing. The figure illustrates an electronic package in accordance with the present invention comprising a semiconductor chip 1 and a heat spreader 2. The heat spreader 2 can be a metal. Suitable metals include copper, nickel-coated copper, aluminum, anodized aluminum and chromium on aluminum. The preferred heat spreader 2 comprises copper. According to preferred aspects of the present invention, the heat spreader also functions as a stiffener. Layer 2 is typically about 2000 to about 4000 Å thick and more typically about 2500 to about 3500 Å.

In accordance with the present invention, layer 3 of codeposited ZnCr is provided between the heat spreader 2 and the integrated circuit chip 1. The ZnCr layer is typically about 20 to about 80 Å thick. Also according to preferred aspects of the present invention, a diffusion barrier layer 12 such as brass is provided between the heat spreader 2 and the ZnCr layer.

A particular heat spreader arrangement suitable as a stiffener as well as including the ZnCr layer is commercially available from Gould. Such is typically a 10 oz. foil but can be ½ to about 20 oz. foil. In particular, the first layer 2 is Cu/Cu O which is about 2500–3500 Å. The second layer 12 is brass (Zn+Cu) which is about 900–1500 Å and acts as a diffusion barrier layer preventing metal diffusion between layers 2 and 3. Layers 2 and 12 are applied electrolytically. The layer of Zn+Cr of about 20–80 Å is applied by electroless deposition. In addition, according to preferred aspects of the present invention, a passivating layer 4 such as nickel on gold or gold is provided on the other major surface of the heat spreader 2. When nickel is employed in layer 4, such is typically about 1000 to about 2000 Å thick, and when gold is employed in layer 4, such is typically about 100 to about 150 Å thick.

An adhesive layer 15 can be located between the layer 4 and heat sink 6. An example of a suitable adhesive is an epoxy composition. This additional layer 15 is to provide enhanced adhesion in the event the package includes a further heat sink 6 such as a copper heat sink.

Adjacent the ZnCr layer 3 is dielectric material 5. The dielectric 5 is present to adhere to integrated circuit chip 1 as well as encapsulating integrated circuit chip 1. Preferably, the dielectric material is a thermally enhanced epoxy adhesive. Preferred compositions include epoxy compositions and polyimide compositions. The dielectric substrate includes circuitry 7 which is then attached to solder balls 8. In addition, electrical connections between circuitry 7 and conductive sites on the integrated circuit chip 1 are provided. The electronic package of the present invention can be mounted on corresponding conductive pads 9 located on an integrated circuit board 10.

In fabricating the electronic packages of the present invention, a composite of layer 2 and ZnCr layer 3 is laminated to the dielectric material surrounding the integrated circuit chip. Typically, temperatures of about 150 to about 200° C. are used along with pressures of about 200 to about 350 psi. In a typical example, the temperature is ramped up to a first setpoint in about 18 minutes to about 150° C.; held there for about 72 minutes. The temperature is then ramped down to about 28° C. in about 35 minutes and held there for about 10 minutes. Next, the electronic package can be positioned on corresponding conductor pads of the integrated circuit board by reflowing the solder balls by subjecting them to elevated temperature and then positioning them on the corresponding conductive pads after which the solder is permitted to resolidify.

The foregoing description of the invention illustrates and describes the present invention. Additionally, the disclosure shows and describes only the preferred embodiments of the invention, but as aforementioned, it is to be understood that the invention is capable of use in various other combinations, modifications and environments and is capable of changes or modifications within the scope of the inventive concept as expressed herein, commensurate with the above teachings and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

What is claimed is:

1. An article comprising a dielectric substrate; a heat spreader located adjacent said dielectric substrate; and a layer of ZnCr intermediate said dielectric substrate and said heat spreader for enhancing adhesion between said dielectric substrate and said metallic heat spreader.

2. The article of claim 1 wherein said heat spreader is a ceramic or metallic.

3. The article of claim 1 wherein said heat spreader is metallic.

4. The article of claim 1 wherein said heat spreader is selected from the group consisting of copper, nickel-coated copper, aluminum, anodized aluminum, and chromium on aluminum.

5. The article of claim 1 wherein said heat spreader is copper.

6. The article of claim 5 wherein said copper is about 2000 to about 4000 Å thick.

7. The article of claim 1 wherein said ZnCr is about 20 to about 80 Å thick.

8. The article of claim 1 which further comprises a diffusion barrier layer located between said heat spreader and the ZnCr layer.

9. The article of claim 8 wherein said diffusion barrier layer is a layer of Zn and Cu.

10. The article of claim 8 wherein said diffusion barrier layer has a thickness of about 900 to about 1500 Å.

11. The article of claim 1 wherein said dielectric substrate is an epoxy composition.

12. The article of claim 1 which further includes an integrated circuit chip encapsulated by said dielectric substrate.

13. A method for fabricating an electronic package which comprises providing a layer of a ZnCr on at least one major surface of a heat spreader; providing an integrated circuit chip surrounded by a dielectric material; positioning the heat spreader with the surface having the layer of ZnCr facing said dielectric material; and then laminating the heat spreader to the dielectric material surrounding said integrated circuit chip.

14. The method of claim 13 wherein said heat spreader is ceramic or metallic.

15. The method of claim 13 wherein said heat spreader is metallic.

16. The method of claim 13 wherein said heat spreader is selected from the group consisting of copper, nickel-coated copper, aluminum, anodized aluminum and chromium on aluminum.

17. The method of claim 13 wherein said heat spreader is copper.

18. The method of claim 13 wherein said copper is about 2000 to about 4000 Å thick.

19. The method of claim 13 wherein the layer of said ZnCr is about 20 to about 80 Å.

20. The method of claim 19 which further includes providing a layer of nickel on gold or gold on the other surface of said heat spreader and providing a second heat sink.

21. The method of claim 13 which further includes positioning said article on corresponding conductor pads of an integrated circuit board by soldering.

* * * * *